(12) United States Patent
Popp et al.

(10) Patent No.: US 9,415,724 B2
(45) Date of Patent: Aug. 16, 2016

(54) DIMMABLE MIRROR DEVICE

(71) Applicant: OSRAM OLED GmbH, Regensburg (DE)

(72) Inventors: Michael Popp, Freising (DE); Benjamin Claus Krummacher, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/648,666

(22) PCT Filed: Dec. 4, 2013

(86) PCT No.: PCT/EP2013/075582
§ 371 (c)(1),
(2) Date: May 29, 2015

(87) PCT Pub. No.: WO2014/090666
PCT Pub. Date: Jun. 19, 2014

(65) Prior Publication Data
US 2015/0314731 A1    Nov. 5, 2015

(30) Foreign Application Priority Data
Nov. 12, 2012 (DE) .......................... 10 2012 222 760

(51) Int. Cl.
*G02B 7/00* (2006.01)
*B60R 1/08* (2006.01)
*G02F 1/157* (2006.01)
*H01L 51/42* (2006.01)

(52) U.S. Cl.
CPC ................ *B60R 1/088* (2013.01); *G02F 1/157* (2013.01); *H01L 51/42* (2013.01)

(58) Field of Classification Search
CPC ..... H01L 51/42; H01L 51/0032; H01L 27/30; G02F 1/157; B60R 1/088
USPC ................... 359/265–275, 896, 900; 345/105
See application file for complete search history.

(56) References Cited

U.S. PATENT DOCUMENTS

| | | | |
|---|---|---|---|
| 7,742,673 B2 | 6/2010 | Li et al. | |
| 9,168,870 B2 * | 10/2015 | Lee | .......................... B60R 1/02 |
| 2003/0122749 A1 | 7/2003 | Booth, Jr. et al. | |
| 2004/0031965 A1 | 2/2004 | Forrest et al. | |
| 2010/0321758 A1 | 12/2010 | Bugno et al. | |
| 2011/0025212 A1 | 2/2011 | Kolosov et al. | |

FOREIGN PATENT DOCUMENTS

| | | |
|---|---|---|
| DE | 202005000979 U1 | 6/2006 |
| WO | 2005015173 A1 | 2/2005 |
| WO | 2007107903 A1 | 9/2007 |
| WO | 2010123362 A1 | 10/2010 |

* cited by examiner

*Primary Examiner* — Tuyen Tra
(74) *Attorney, Agent, or Firm* — Slater Matsil, LLP (57) ABSTRACT

A dimming mirror device has a substrate having an electrochromic material that has a controllable transparency. At least one organic optoelectronic element, which has an organically functional layer stack, is arranged on the substrate. This element has at least one organic optoelectronic layer between two electrodes. The layer detects, in a first operational state of the mirror device, ambient light through the substrate such that the organic optoelectronic element acts, in the first operational state, as an element detecting organic light. The transparency of the substrate can be controlled in the first operational state in accordance with a measurement signal from the organic optoelectronic element.

19 Claims, 7 Drawing Sheets

DIMMABLE MIRROR DEVICE

This patent application is a national phase filing under section 371 of PCT/EP2013/075582, filed Dec. 4, 2013, which claims the priority of German patent application 10 2012 222 760.1, filed Dec. 11, 2012, each of which is incorporated herein by reference in its entirety.

TECHNICAL FIELD

A dimmable mirror device is specified.

BACKGROUND

In order, in the case of an interior rear-view mirror of an automobile, for example, to reduce glare for the driver caused by the headlights of the following traffic, the rear-view mirror can comprise a dimmable mirror surface which is controlled depending on a measurement signal of a brightness sensor in the vicinity of the mirror surface or in the region of the interior rear-view mirror. Polycrystalline large-area detectors or solar cells are also known for controlling the mirror brightness.

However, this usually involves separate, external sensors which, moreover, have no further functionality apart from the mirror brightness.

SUMMARY

Embodiments of the invention specify a dimmable mirror device.

In accordance with at least one embodiment, a dimmable mirror device comprises a substrate comprising an electrochromic material which has a controllable transparency. For this purpose, the substrate can comprise or be composed of, as electrochromic material, for example, an electrochromic glass, for example, $WLiO_3$, and/or an electrochromic foil comprising an electrochromic polymer or a plurality or a laminate comprising these. Furthermore, the substrate can additionally also comprise one or a plurality of transparent glass and/or plastic layers. The substrate can be as far as possible transparent and in particular brightly translucent to light, for example, in one state of the electrochromic material. In a further state of the electrochromic material, the substrate can appear less transparent and in particular dimmable. The electrochromic material can be arranged over the entire main extension plane of the substrate or in one or a plurality of partial regions, such that the substrate, along its main extension plane, can also have one or a plurality of partial regions which contain no electrochromic material and are, for example, unchangeably transparent.

Here and hereinafter, "transparent" denotes a layer which is transmissive to visible light. In this case, the transparent layer can be clearly translucent or at least partly light scattering and/or partly light absorbing, such that a layer designated as transparent can, for example, also be diffusely or milkily translucent. Particularly preferably, a layer designated here as transparent is embodied as transmissive to visible light as far as possible in such a way that in particular the absorption of light generated in the organic light emitting element is as low as possible.

Furthermore, the mirror device comprises a reflective layer, which is situated behind the substrate and in particular behind the electrochromic material, as viewed from an observer. The electrochromic material of the substrate can be arranged in particular in the region of the reflective layer. That means that the electrochromic material covers the reflective layer, as viewed from an observer, such that light incident from outside, that is to say ambient light, which is reflected at the reflective layer passes through the electrochromic material. By changing the transparency of the substrate with the aid of the electrochromic material, which can be driven by electrical contact elements, it is possible to regulate the mirror effect of the mirror device. In particular, the mirror device can appear darker and darker with decreasing transparency of the substrate as a result of corresponding control of the electrochromic material.

By way of example, the mirror device can be embodied as a rear-view mirror, in particular as an interior rear-view mirror, of a motor vehicle, for example, of a truck or of a car, wherein the electrochromic material can achieve a reduction of the glare which can be brought about, for example, by light from the headlights of the following traffic.

Furthermore, the mirror device comprises on the substrate at least one organic optoelectronic element comprising an organic functional layer stack having at least one organic optoelectronic layer between two electrodes. Here and hereinafter, "on the substrate" means, in particular, that the at least one organic optoelectronic element is arranged on a top surface of the substrate facing away from the observer and the at least one organic optoelectronic element is in direct contact with the top surface at least in places.

The at least one organic optoelectronic layer is embodied at least as an organic light detecting layer which can detect ambient light through the substrate in a first operating state of the mirror device, such that the organic optoelectronic element acts as an organic light detecting element in the first operating state. The organic optoelectronic element can thus be designed, in the first operating state, upon incidence of ambient light thereon, to convert it into an electrically measurable signal, for example, into a photovoltage, into a photocurrent or into a light-dependent electric al resistance.

Here and hereinafter, "ambient light" denotes light which can impinge from outside on the mirror device, that is to say which is not guided within the mirror device by means of internal scattering or light guiding effects from a light emitting element to the organic optoelectronic element.

Furthermore, the organic optoelectronic element can be arranged behind the electrochromic material in the direction of incidence of the ambient light, such that the at least one organic optoelectronic layer can detect the ambient light through the electrochromic material. As an alternative thereto, it is also possible for the organic optoelectronic element to be arranged in a manner laterally offset with respect to the electrochromic material, such that the at least one organic optoelectronic layer can detect the ambient light through a partial region of the substrate whose transparency is not regulatable by the electrochromic material and which is thus permanently transparent.

Here and hereinafter, "lateral" denotes a direction parallel to the main extension plane of the substrate. A lateral direction is thus directed, for example, perpendicularly to the stacking direction of the electrodes and of the organic functional layer stack of the at least one organic optoelectronic element.

The transparency of the substrate and in particular of the electrochromic material can be regulated depending on a measurement signal of the organic optoelectronic element in the first operating state. The first operating state can be the sole operating state of the mirror device, depending on the embodiment of the mirror device. Furthermore, the mirror device can have even further operating states, as is explained further below, in which the organic optoelectronic element does not act as an organic light detecting element, but rather as an organic light emitting element, or else is not operated.

The reflective layer is arranged at least partly or else completely on a side of the organic functional layer stack facing away from the substrate, such that, in the arrangement direction of the layers of the organic optoelectronic element, the at least one organic optoelectronic layer is situated between the substrate and the reflective layer. The reflective layer can be continuous or subdivided into partial regions.

Furthermore, the substrate can be embodied as a production carrier for the optoelectronic element. In this case, it is possible for the functional layer stacks and the electrodes of the organic optoelectronic element to be applied successively on the top surface of the substrate, such that the substrate is that substrate which is provided for producing the organic optoelectronic element. In other words, the organic light emitting and light detecting elements are not produced on dedicated substrates and then arranged on the common substrate, but rather are produced on the common substrate.

In particular, at least one electrode of the organic optoelectronic element can directly adjoin the substrate, that is to say that it can be in direct contact with the top surface of the substrate. A base surface of the substrate facing the observer then forms an outer surface of the mirror device and remains for the most part free of material. The base surface then preferably serves as a light entrance surface for the ambient light. It is furthermore possible for the substrate to be the sole substrate of the mirror device. However, it is also possible for the mirror device to comprise a multiplicity of substrates each comprising an electrochromic material, wherein a respective organic optoelectronic element comprising at least one organic optoelectronic layer between two electrodes can be assigned one-to-one to each of the substrates.

The substrate forms in particular the mechanically supporting component of the assigned organic optoelectronic element.

In accordance with a further embodiment, the reflective layer comprises or consists of the electrode of the organic optoelectronic element facing away from the substrate. In other words, it is possible for the organic optoelectronic element to comprise a reflective electrode which is arranged above the organic functional layer stack, as viewed from the substrate, and which forms at least one part of the reflective layer.

In accordance with a further embodiment, the dimmable mirror device comprises a mirror surface having a mirror layer, which is arranged, for example, laterally adjacently to the organic optoelectronic element on the substrate and which forms a part of the reflective layer.

In accordance with a further embodiment, the dimmable mirror device comprises a mirror layer having a regulatable reflectivity on an opposite side of the organic optoelectronic element relative to the substrate, while that electrode of the organic optoelectronic element which is arranged facing away from the substrate is embodied as transparent or at least partly or regionally light-transmissive. The reflective layer of the mirror device can comprise or be composed of the mirror layer having a regulatable reflectivity. In particular, the mirror layer having a regulatable reflectivity can also have a regulatable transparency, such that the mirror layer can optionally be switched to be reflective or transparent. By way of example, the mirror layer having a regulatable reflectivity can comprise an electrochromic material and/or a liquid crystal material and/or switchable mirror elements. The mirror layer having a regulatable reflectivity can be designed to switch the opposite side of the mirror device relative to the substrate from a reflective state to an at least partly transparent state in desired measurement intervals, during which at least partly transparent state the organic optoelectronic element can also detect ambient light on the side of the mirror device facing away from the substrate. Such a measurement can be suitable as a reference measurement, for example, by means of which the general brightness, that is to say, for example, the daylight, can be ascertained, such that the transparency of the electrochromic material of the mirror device is regulated, for example, only if the general brightness falls below a certain value, that is to say, for example, during the night or in dark surroundings.

In accordance with a further embodiment, the electrode of the organic optoelectronic element facing the substrate is embodied as transparent. By way of example, a transparent electrode can be composed of or comprise a transparent conductive oxide (TCO). Furthermore, a transparent electrode can additionally or alternatively comprise a transparent metal, network structures and/or graphene. A reflective electrode can comprise a reflective metal, for example.

In accordance with a further embodiment, the at least one organic optoelectronic layer of the organic functional layer stack of the organic optoelectronic element is additionally embodied as an organic light emitting layer which emits light in a second operating state of the mirror device. In the second operating state, the organic optoelectronic element can thus act as an organic light emitting diode (OLED) and emit light through the substrate. By switching to the first or second operating state, the mirror device can optionally be operated as a dimmable mirror device or as a lighting device.

In accordance with a further embodiment, the mirror device comprises an organic light emitting element laterally adjacently to the organic optoelectronic element on the substrate, which organic light emitting element can emit light through the substrate. In particular, the organic light emitting element is arranged on the same side of the substrate as the organic optoelectronic element. Preferably, the organic light emitting element can be operated in a different operating state than the first operating state, such that the mirror device can optionally be operated as a dimmable mirror or as a lighting device. The organic light emitting element comprises between two electrodes an organic functional layer stack having at least one organic light emitting layer. The organic optoelectronic element and the organic light emitting element can be embodied identically with regard to their construction, that is to say with regard to the electrodes and/or the respective organic functional layer stack. As an alternative thereto, the elements can also be embodied differently. By way of example, the organic light emitting element can comprise, on the side facing away from the substrate, an electrode embodied as reflective. The reflective electrode can be part of the reflective layer of the mirror device or the reflective layer of the mirror device can consist of the reflective electrode of the organic light emitting element.

In accordance with a further embodiment, the mirror device comprises an organic light detecting element laterally adjacently to the organic optoelectronic element on the substrate. The organic light detecting element can be designed, for example, to detect ambient light which is radiated onto the mirror device from an opposite side of the mirror device relative to the substrate. As already described further above, it is thereby possible to measure, for example, the general brightness, that is to say, for example, the daylight, as reference light, such that the mirror device and in particular the electrochromic material of the substrate and thus the dimming function can be operated depending on the general brightness.

In accordance with a further embodiment, the dimmable mirror device comprises on the organic optoelectronic element, as viewed from the substrate, an organic light detecting element and/or a further organic optoelectronic element, which can in each case detect ambient light which is radiated onto the mirror device from the opposite side relative to the substrate. The organic optoelectronic elements arranged one on top of another or the organic optoelectronic element and the organic light detecting element arranged thereon can be embodied identically, for example. The organic light detecting element and/or the further organic optoelectronic element can comprise in each case between two electrodes an organic functional layer stack having at least one organic light detecting layer and/or an organic optoelectronic layer, wherein one of the electrodes is formed by one of the electrodes of the organic optoelectronic element on the substrate. In other words, the organic optoelectronic element on the substrate and the organic light detecting or optoelectronic element arranged thereabove can comprise a common electrode.

In accordance with a further embodiment, an element of the mirror device which can detect light, that is to say the organic optoelectronic element and, where applicable, a further organic light detecting or optoelectronic element, is embodied and usable as an organic photodiode and/or as an organic photoconductor and/or as an organic photoresistor.

An organic photodiode can comprise in particular an organic functional layer stack between two electrodes, wherein the organic functional layer stack has as an organic light detecting layer at least one pn junction for generating charge carriers. By way of example, the organic photodiode, with regard to the electrodes and the organic functional layer stack, can have the same construction as an organic light emitting element, that is to say in particular an OLED, and can be operated inversely with respect thereto, that is to say with opposite electrical polarity. As a result it may be possible, for example, for all the organic optoelectronic, light detecting and light emitting elements of the mirror device to be embodied identically, as a result of which an unchanged process implementation without additional outlay and without additional costs may be possible during production in comparison with, for example, conventional surface emitters such as OLEDs. As an alternative thereto, the organic photodiode, in comparison with an organic light emitting element, can comprise other materials and/or other layer constructions with regard to the electrodes and/or the organic functional layer stack, as a result of which, although an additional outlay may be necessary during manufacture, the sensitivity of the organic photodiode can also be adapted in a targeted manner.

An organic photoconductor can comprise an organic photoconductive material which generates electrical charges upon irradiation by light. Organic photoconductive materials can be embodied, for example, in one layer on an electrically conductive layer, for example, an electrode. Furthermore, organic photoconductive materials can be embodied, for example, in at least two layers comprising at least one organic layer which generates charge carriers and an organic layer which transports charge carriers. Furthermore, an organic optoelectronic and/or light detecting element embodied as an organic photoconductor can have the same construction as an organic light emitting element, for example, an OLED.

Depending on the materials and construction, an organic photoconductor can also be constructed as an organic photodiode. Such an organic element can be usable as photodiode with an electrical bias voltage and as photoconductor without an electrical bias voltage. Furthermore, depending on the materials and construction used, the electrical resistance can also be measured additionally or alternatively.

In accordance with a further embodiment, the mirror device comprises a plurality of organic optoelectronic elements and/or a plurality of organic light detecting elements and/or a plurality of organic light emitting elements laterally adjacently on the substrate.

The substrate can be in particular the sole substrate of the mirror device for the organic optoelectronic element and, where applicable, for further organic elements. The layers of the organic element or elements are in this case applied successively in particular on the substrate, such that the substrate is that substrate which is necessary and provided for producing the organic element or elements. In other words, the organic optoelectronic element and, where applicable, further organic light emitting and/or light detecting elements are not produced on dedicated substrates and then arranged on the substrate comprising the electrochromic material, but rather are produced on the substrate comprising the electrochromic material. Consequently, in this case, no further substrate is arranged in particular between the substrate and the organic functional layers of the organic elements.

In the case of the dimmable mirror device described here, use is made of at least one sensor element in the form of the organic optoelectronic element which is embodied such that in at least one operating state as an organic light detecting element in the form of an organic photodiode, an organic photoconductor or an organic photoresistor it can detect ambient light through a substrate, which forms the viewing side of the mirror device, and, where applicable, also on the opposite side. Upon the incidence of ambient light, in particular of ambient light having a specific minimum brightness such as from automobile headlights, for example, an automatic dimming of the mirror device may be possible by virtue of the fact that the signal of the at least one sensor element which detects the illumination at the front or rear side is used directly for controlling the electrochromic material of the substrate. The organic optoelectronic element and, where applicable, further organic light detecting or optoelectronic elements can be incorporated as sensor element separately and, for example, over a large area in the region of a reflective layer or the reflective layer can be a part of one or a plurality of the organic elements. In addition to the light detecting function, the organic optoelectronic element can also be designed to be used as a lighting source in a further operating state.

By way of example, in the case of an additional organic light detecting or light emitting element, the latter can have the same layer construction as the organic optoelectronic element, such that as a result of a monolithic integration separated area regions having the same layer construction can be used as sensors and/or light sources. As a result, separate lighting elements or sensor elements, as in the case of conventional dimmable mirrors, are not necessary and the organic elements can form, for example, a large-area sensor element and/or a large-area lighting element, without additional costs arising. As a result, in the dimmable mirror device itself an automated signal generation is possible by means of at least one monolithically integrated sensor for switching dimming elements, that is to say in particular the electrochromic material in the substrate, in order to prevent glare, for example.

BRIEF DESCRIPTION OF THE DRAWINGS

Further advantages, advantageous embodiments and developments will become apparent from the exemplary embodiments described below in association with the figures.

In the figures:

FIGS. 7 to 9 show schematic illustrations of dimmable mirror devices in accordance with further exemplary embodiments.

In the exemplary embodiments and figures, elements that are identical, of identical type or act identically may be provided in each case with the same reference signs. The illustrated elements and their size relationships among one another should not be regarded as true to scale; rather, individual elements such as, for example, layers, component parts, components and regions may be illustrated with an exaggerated size in order to enable better illustration and/or in order to afford a better understanding.

DETAILED DESCRIPTION OF ILLUSTRATIVE EMBODIMENTS

Figure 1:
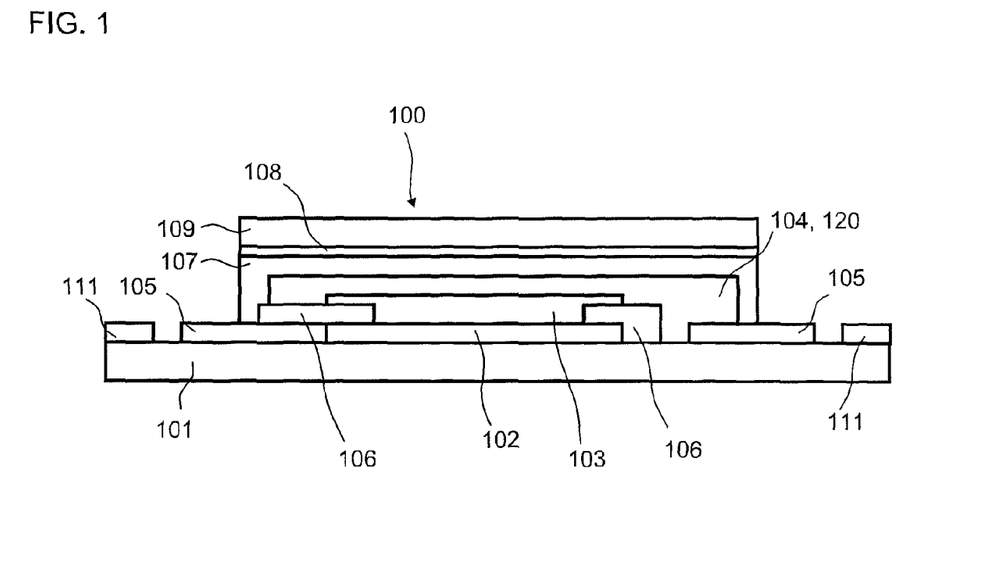
FIG. 1 shows a schematic illustration of a dimmable mirror device in accordance with one exemplary embodiment.

FIG. 1 shows a dimmable mirror device in accordance with one exemplary embodiment, which can be embodied, for example, as a rear-view mirror of a motor vehicle, for instance as an interior rear-view mirror of a car or truck. Housing parts which are customary, for example, for interior rear-view mirrors or other mirror devices are not shown, for the sake of clarity.

The mirror device comprises a substrate 101, on which an organic optoelectronic element 100 and a reflective layer 120 are arranged, wherein the substrate side is that side of the mirror device which faces an observer, such that the reflective layer 120 lies behind the substrate 101 in the viewing direction.

The substrate 101 comprises an electrochromic material which has a controllable transparency. The substrate 101 can comprise as electrochromic material, for example, an electrochromic glass, for example, $WLiO_3$, and/or an electrochromic foil comprising an electrochromic polymer or a plurality or a laminate comprising these. Furthermore, the substrate 101 can additionally also comprise one or a plurality of transparent glass or plastic layers. By way of example, the substrate 101 can also comprise a protective glass and alternatively or additionally some other protective layer. In particular, the substrate 101 can also be flexible, such that the mirror device can also be flexible.

In one state of the electrochromic material, the substrate 101 can be as far as possible transparent and in particular brightly translucent to light. In a further state of the electrochromic material, the substrate 101 can appear less transparent and in particular dimmed. In particular, the electrochromic material can be embodied such that it is possible to achieve a continuous reduction of the transparency of the substrate 101 and thus a continuous dimming of the mirror device. For control, that is to say in particular for electrical contacting and for regulation of the transparency, of the electrochromic material of the substrate 101, contact elements 111 are provided on the substrate 101. The contact elements 111 are, for example, spaced apart laterally with respect to the organic optoelectronic element 100 and are in direct contact with the top surface of the substrate 101.

The electrochromic material can extend in the main extension plane of the substrate 101 over the entire substrate 101, such that the entire area formed by the substrate 101 can be dimmed by regulation of the electrochromic material. As an alternative thereto, the electrochromic material can be arranged in one or a plurality of partial regions, such that the substrate 101 can also have along its main extension plane one or a plurality of partial regions which contain no electrochromic material and are, for example, unchangeably transparent. At all events, the electrochromic material is arranged in such a way that the reflective layer 120 is situated behind the electrochromic material, as viewed from an observer.

Furthermore, the substrate 101 and thus also the mirror device can be fixed or flexible or else, for example, concavely curved for a magnification effect.

The organic optoelectronic element 100 comprises electrodes 102, 104 on the substrate 101, and an organic functional layer stack 103 having at least one organic functional layer is arranged between said electrodes.

The organic functional layer stack 103 between the electrode 102, 104 has an organic functional layer which is embodied as an organic light detecting layer and which can detect ambient light through the substrate 101 in a first operating state of the mirror device, such that the organic optoelectronic element 100 acts as an organic light detecting element in the first operating state. The organic optoelectronic element 100 is thus designed, in the first operating state, upon incidence of ambient light, to convert the latter into an electrically measurable signal, for example, into a photovoltage, into a photocurrent or into a light-dependent electrical resistance. For this purpose, the organic optoelectronic element can be embodied as an organic photodiode, an organic photoconductor and/or as an organic photoresistor, as explained above in the general part.

Upon incidence of ambient light, in particular of ambient light having a specific brightness such as, for example, from automobile headlights, in the first operating state an automatic dimming of the mirror device may be possible by virtue of the fact that the signal of the organic optoelectronic element 100 is used directly for controlling the electrochromic material of the substrate 101 by means of a suitable regulating circuit.

Furthermore, in the exemplary embodiment shown, the at least one organic optoelectronic layer of the organic functional layer stack 103 of the organic optoelectronic element 100 is additionally embodied as an organic light emitting layer which can emit light in a second operating state of the mirror device. In the second operating state, the organic optoelectronic element 100 can thus act as an organic light emitting diode (OLED) and emit light through the substrate 101. For this purpose, the organic functional layer stack 103 can have a suitable diode layer construction which can be operated in a light detecting or light emitting manner by means of different polarity, that is to say by means of operation in the reverse direction or in the forward direction. By switching to the first or second operating state, the mirror device can thus optionally be operated as a dimmable mirror device or as a lighting device. As an alternative to the exemplary embodiment shown, the organic optoelectronic element 100 can also be embodied only as an organic light detecting element, such that the mirror device shown in this case can be operated only in the first operating state without an additional lighting function.

The bottom electrode 102, that is to say the electrode arranged facing the substrate 101, is embodied as transparent and comprises a transparent conductive oxide, for example. Transparent conductive oxides (TCO) are transparent conductive materials, generally metal oxides, such as, for example, zinc oxide, tin oxide, cadmium oxide, titanium oxide, indium oxide and indium tin oxide (ITO). Alongside binary metal-oxygen compounds, such as, for example, ZnO, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and can also be p- or n-doped. Alternatively or additionally, the bottom electrode 102 can comprise graphene, metal wires and/or metal meshes. These materials can in particular also be combined with a layer composed of a TCO material for forming the electrode and increase the transverse conductivity of the electrode.

Furthermore, the transparent electrode 102 can comprise a transparent metal, that is to say a metal suitable for electrodes which is mentioned further below, having a thickness which is small enough such that the electrode 102 is at least partly transmissive to light. Furthermore, the transparent electrode 102 can comprise, for example, metallic network structures and/or graphene or combinations of the transparent materials mentioned.

The further electrode 104 on the organic functional layer stack 103 is embodied as reflective and comprises a metal, which can be selected from aluminum, barium, indium, silver, gold, magnesium, calcium and lithium, and compounds, combinations and alloys therewith. In particular, the electrode 104 can comprise graphite, graphene, Ag, Al or alloys or layer stacks comprising these, for example, Ag/Mg, Ag/Ca, Mg/Al or Mo/Al/Mo or Cr/Al/Cr. Alternatively or additionally, the electrode 104 can also comprise an abovementioned TCO material or a layer stack comprising at least one TCO and at least one metal.

In the exemplary embodiment shown, the reflective layer 120 of the mirror device comprises the electrode 104 of the organic optoelectronic element 100. In particular, in the exemplary embodiment shown, the reflective layer 120 is formed by the electrode 104.

For electrically contacting the electrodes 102 and 104, as is shown in FIG. 1, electrode connection pieces 105 can be provided, which extend through below the encapsulation 107 (described further below) from the electrodes 102, 104 toward the outside. The electrode connection pieces 105 embodied as electrical contact feeds, can be embodied as transparent or non-transparent and can comprise or be composed of a TCO and/or a metal, for example. By way of example, the electrode connection pieces 105 can be formed by a metal layer or a metal layer stack, for example, Mo/Al/Mo, Cr/Al/Cr or Al.

The electrodes 102, 104 are preferably embodied in large-area and continuous fashion, such that the organic optoelectronic element 100 is shaped as a large-area sensor element and as a large-area luminous source, in particular as a surface light source. In this case, "large-area" can mean that the organic optoelectronic element 100 forms as far as possible the entire specularly reflective area of the mirror device. As an alternative thereto, a mirror surface having a mirror layer can also additionally be provided laterally adjacently to the organic optoelectronic element 100 and can enlarge the specularly reflective area of the mirror device. Furthermore, it may also be possible that, for example, the bottom electrode 102 of the organic optoelectronic element 100 is embodied in a structured fashion, as a result of which a structured luminous impression can be given in the second operating state.

The organic functional layer stack 103 can comprise, in addition to the at least one organic optoelectronic layer, which acts as light emitting or light detecting depending on circuitry, further organic layers, for example, one or more selected from a hole injection layer, a hole transport layer, an electron blocking layer, a hole blocking layer, an electron transport layer, an electron injection layer and a charge generation layer (CGL), which are suitable for conducting holes or electrons to or from the organic optoelectronic layer or for blocking the respective transport. The layers of the organic functional layer stack 103 can comprise organic polymers, organic oligomers, organic monomers, organic small, non-polymeric molecules ("small molecules"), or combinations thereof. Suitable materials and layer combinations for layer constructions for organic optoelectronic elements, in particular for organic light detecting and light emitting elements, are known to the person skilled in the art and are therefore not explained any further here.

Furthermore, as shown in FIG. 1, insulator layers 106 can be present, for example, comprising or composed of polyimide, which insulator layers can electrically insulate the electrodes 102, 104 from one another, for example. Depending on the configuration of the individual layers of the organic optoelectronic element 100, insulator layers 106 moreover need not be absolutely necessary and may be absent, for instance in the case of corresponding mask processes for applying the layers.

An encapsulation 107 for protecting the organic functional layer stack 103 and the electrodes 102, 104 is arranged above the organic functional layer stack 103 and the electrodes 102, 104, as viewed from the substrate. In this case, the encapsulation 107 is particularly preferably embodied as a thin-film encapsulation.

In the present case, an encapsulation embodied as a thin-film encapsulation is understood to mean a device suitable for forming a barrier with respect to atmospheric substances, in particular with respect to moisture and oxygen and/or with respect to further damaging substances such as, for instance, corrosive gases, for example, hydrogen sulfide. In other words, the thin-film encapsulation is embodied in such a way that at most very small portions of atmospheric substances can penetrate through it. This barrier effect in the case of the thin-film encapsulation is substantially produced by barrier layers and/or passivation layers which are embodied as thin layers and which are part of the encapsulation. The layers of the encapsulation generally have a thickness of less than or equal to a few 100 nm.

In particular, the thin-film encapsulation can comprise or consist of thin layers which are responsible for the barrier effect of the encapsulation. The thin layers can be applied for example, by means of an atomic layer deposition (ALD) method or molecular layer deposition (MLD) method. Suitable materials for the layers of the encapsulation arrangement are, for example, aluminum oxide, zinc oxide, zirconium oxide, titanium oxide, hafnium oxide, lanthanum oxide, tantalum oxide. The encapsulation preferably comprises a layer sequence having a plurality of the thin layers, each having a thickness of between one atomic layer and a few 100 nm.

As an alternative or in addition to thin layers produced by means of ALD or MLD, the encapsulation can comprise at least one or a plurality of further layers, that is to say in particular barrier layers and/or passivation layers, which are deposited by thermal vapor deposition or by means of a plasma-assisted process, for instance sputtering, chemical vapor deposition (CVD) or plasma-enhanced chemical vapor deposition (PECVD). Suitable materials therefor may be the abovementioned materials and silicon nitride, silicon oxide, silicon oxynitride, indium tin oxide, indium zinc oxide, aluminum-doped zinc oxide, aluminum oxide, and mixtures and alloys of the materials mentioned. The one or the plurality of further layers can have, for example, in each case a thickness of between 1 nm and 5 µm and preferably between 1 nm and 400 nm, inclusive of the limits.

As an alternative or in addition to a thin-film encapsulation, the encapsulation 107 can also comprise a glass lid which, for example, in the form of a glass substrate having a cavity, is adhesively bonded on the substrate 101 by means of an adhesive layer. Furthermore, a moisture-absorbing substance (getter), for example, composed of zeolite, can be adhesively bonded into the cavity in order to bind moisture, oxygen or other damaging gases which can penetrate through the adhesive. Furthermore, the adhesive layer for fixing the lid on the substrate may also itself be absorbent for damaging substances and/or adhesive layer structures may be present.

Furthermore, as shown in FIG. 1, a cover 109 adhesively bonded by means of an adhesive layer 108 can be arranged on the encapsulation 107, as viewed from the substrate 101. The cover 109, which can also be designated as "superstrate" in view of its arrangement in comparison with the substrate 101, can be formed, for example, by a glass layer or glass plate or else a plastic, graphite a metal or a combination or a laminate of the materials mentioned and, in particular in conjunction with an encapsulation 107 embodied as a thin-film encapsulation, can serve as mechanical protection, in particular as anti-scratch protection, without the cover 109 itself having to have an encapsulating effect. Alternatively or additionally, a protective lacquer, for example, in the form of a spray lacquer, can also be applied on the encapsulation 107.

The exemplary embodiments of dimmable mirror devices shown below in each case comprise an organic optoelectronic element 100 which can be embodied in accordance with the exemplary embodiment in FIG. 1 or which can have modifications or variations with respect thereto. The contact elements 111 for electrically contacting and regulating the electrochromic material of the substrate 101 are not shown in the following figures, for the sake of clarity.

Figure 2A:
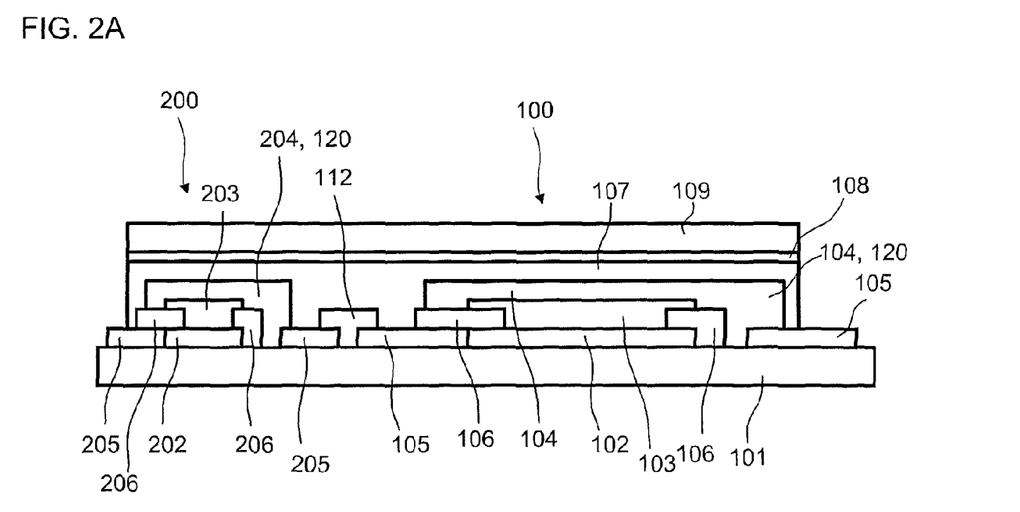
FIGS. 2A and 2B show schematic illustrations of a dimmable mirror device and of the light relationships in accordance with further exemplary embodiments.

FIG. 2A shows a dimmable mirror device in accordance with a further exemplary embodiment, comprising an organic light emitting element 200 alongside an organic optoelectronic element 100, which, purely by way of example, is embodied only as an organic light detecting element for controlling the transparency of the substrate 101. The organic light emitting element 200 is arranged together with the organic optoelectronic element 100 on the substrate 101, such that the substrate 101 forms a common substrate for the organic optoelectronic element 100 and the organic light emitting element 200. In particular, the organic optoelectronic element 100 and the organic light emitting element 200 are arranged on the same side of the common substrate 101 in laterally adjacent area regions.

In the exemplary embodiment shown, the organic light emitting element 200 is embodied as an organic light emitting diode comprising an organic functional layer stack having at least one organic functional layer between electrodes 202, 204. In particular, the organic light emitting element 200 in the exemplary embodiment shown, with regard to the electrodes 202, 204 and the organic functional layer stack 203, has the same construction as the organic optoelectronic element 100 with regard to the electrodes 102, 104 and the organic functional layer stack 103 and can be connected and operated inversely with respect to the organic optoelectronic element 100, that is to say with opposite electrical polarity. As a result, the manufacture of the mirror device shown may cause no or only low additional costs in comparison with the mirror device of the exemplary embodiment in FIG. 1. As an alternative thereto, the organic light emitting element 200, in comparison with the organic optoelectronic element 100, can comprise different materials and/or different layer constructions with regard to the electrodes 202, 204 and/or the organic functional layer stack 203.

The mirror device furthermore comprises an encapsulation 107, which is embodied as a thin-film encapsulation and which forms a common encapsulation for the organic optoelectronic element 100 and the organic light emitting element 200. In other words, the encapsulation 107 extends with large area and continuously over the functional layers of the organic optoelectronic element 100 and of the organic light emitting element 200. A common cover 109 is fixed on the common encapsulation 107 by means of an adhesive layer 108.

Furthermore, electrode connection pieces 205 are present, which serve for electrically contacting the electrodes 202, 204 and which can be embodied like the electrode connection pieces 105 of the organic optoelectronic element 100. The electrode connection pieces 105, 205 extend from the elements 100, 200 out of the encapsulation 107, such that the elements 100, 200 can be contacted externally. The electrodes 202, 204 are electrically insulated from one another by insulator layers 206.

An electrical insulator layer 112 is arranged between the organic optoelectronic element 100 and the organic light emitting element 200 directly on the substrate 101, said electrical insulator layer being covered by the common encapsulation 107. The electrical insulator layer 112, which can comprise or be composed of polyimide or some other electrically insulating material, for example, serves for electrically insulating the organic light emitting element 200 from the organic optoelectronic element 100, such that the electrode connection pieces 105, 205 of the elements 100, 200 can also be arranged at a small distance from one another on the common substrate 101, without the occurrence of an electrical crosstalk between the elements 100, 200.

Figure 2B:
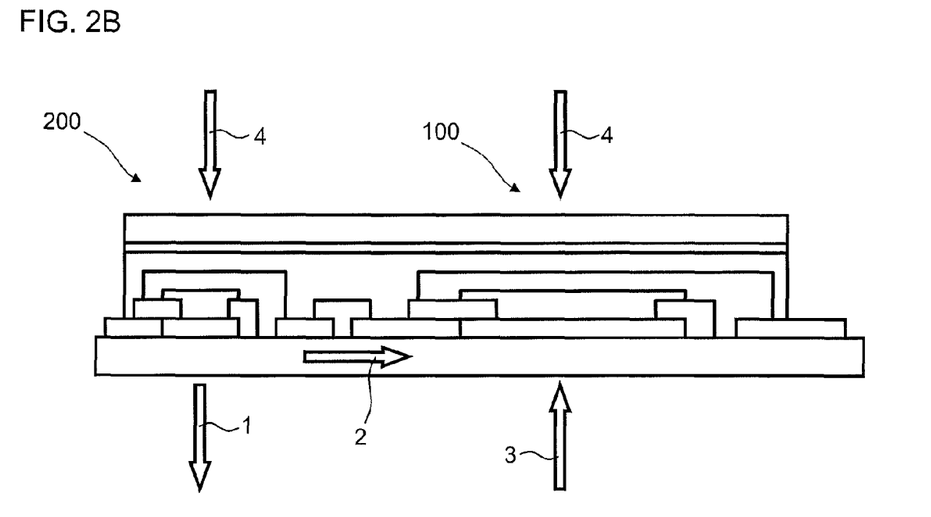

FIG. 2B indicates the light relationships for the mirror device from FIG. 2A. In FIG. 2B and also in the subsequent figures, the reference signs of the individual layers and elements of the mirror device respectively shown are depicted principally only with regard to differences with respect to the previously described exemplary embodiments, for the sake of clarity.

The organic light emitting element 200 in FIGS. 2A and 2B during operation emits light 1 through the substrate 101, such that in particular in a second operating state of the mirror device the latter can be used for illumination. The substrate side of the mirror device thus forms the emission side. Through the transparent substrate 101, part of the light generated by the organic light emitting element 200 can also be guided to the organic optoelectronic element 100 on account of scattering and waveguiding effects, as indicated by the reference sign 2. Furthermore, depending on the embodiment of the electrodes and insulator layers, light may possibly also pass through the common encapsulation from the organic light emitting element 200 to the organic optoelectronic element 100. By means of a targeted adaptation of the distance between the organic light emitting element 200 and the organic optoelectronic element 100 and in this case in particular with regard to an absorption in the common substrate, by means of a suitable choice of materials with regard to the electrodes, the insulator layers and the encapsulation, for example, with regard to a suitable refractive index for avoiding total internal reflection in the substrate or the cover, and by means of suitable materials which are non-transparent at least in places, the light 2 guided internally from the organic light emitting element 200 to the organic optoelectronic element 100 can be reduced or completely suppressed.

Ambient light can be incident on the substrate side, indicated by the reference signs 3, and/or on the opposite side relative to the substrate, that is to say on the side of the cover, indicated by the reference signs 4. The ambient light 3, 4 can be, for example, light from natural or artificial light sources. With regard to the use of the mirror device as a rear-view mirror in a motor vehicle, the ambient light 4 can in particular also be the general ambient light which enables a measurement of the general brightness, for example, brightness dependent on the time of day, while the ambient light 3 can also comprise light from headlights of the following traffic, which, without dimming by means of the electrochromic material of the substrate 101, can lead to glare for an observer of the mirror device.

The following exemplary embodiments show further variations and modifications of the dimmable mirror device which exhibit, inter alia, variation possibilities in terms of construction and for light detection. By way of example, it is possible to vary the type of the organic optoelectronic, light detecting and/or light emitting elements with regard to the construction and the functioning and/or the electrical circuitry, the number of elements, the position of one or more organic light detecting or optoelectronic elements in relation to the luminous area of an organic light emitting element, a mirror or other elements, and/or the detection area of an organic light detecting or optoelectronic element, for example, in relation to an adaptation to the environment in terms of geometry, stack and/or circuitry. Furthermore, provision can be made of a plurality of organic optoelectronic, light detecting and/or light emitting elements for detecting ambient light on different sides, and/or for varying the light emission. Furthermore, an additional mirror layer or additional electrochromic glasses, foils and/or layers can be provided.

Figure 3:
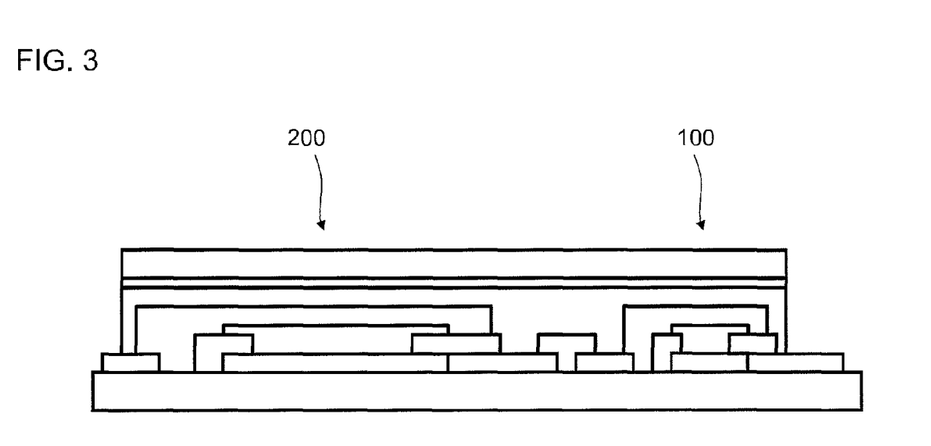
FIGS. 3 to 5 show schematic illustrations of dimmable mirror devices in accordance with further exemplary embodiments.

FIG. 3 shows, for example, one exemplary embodiment of a mirror device comprising, in comparison with the exemplary embodiment in FIG. 1, an organic optoelectronic element 100 and an organic light emitting element 200. In comparison with the exemplary embodiment in FIGS. 2A and 2B, the organic light emitting element 200 in FIG. 3 has a larger area than the organic optoelectronic element 100, such that the luminous area for operation in the second operating state is significantly larger than the sensor area for operation in the first operating state. In particular, the reflective layer of the mirror device can be formed by or at least comprise the reflective electrode of the organic light emitting element 200.

By way of example, in the case of such an embodiment, the organic optoelectronic element 100 can also be laterally offset with respect to the electrochromic material of the substrate, such that the organic optoelectronic element 100 can measure the ambient light incident through the substrate independently of the transparency of the substrate.

In the exemplary embodiments in FIGS. 2A to 3, the organic light emitting element 100 can also be operated simultaneously with the organic optoelectronic element 100.

Figure 4:
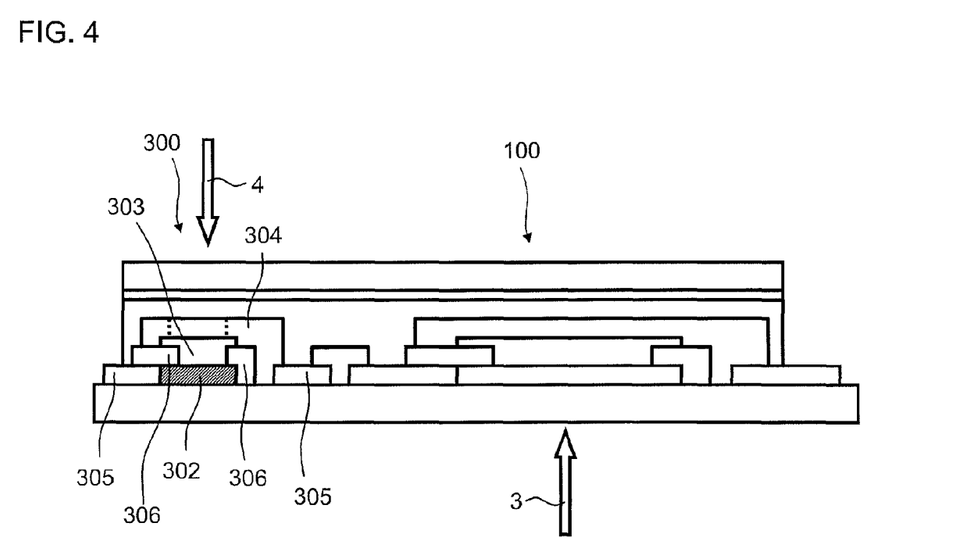

FIG. 4 shows a further exemplary embodiment of a mirror device comprising, in comparison with the previous exemplary embodiments, an organic light detecting element 300 in addition to the organic optoelectronic element 100, which, as in the exemplary embodiment in FIG. 1, is embodied as light detecting and light emitting.

In the exemplary embodiment shown, the organic light detecting element 300 is embodied and usable as an organic photodiode. The organic light detecting element 300 comprises an organic functional layer stack 303 between two electrodes 302, 304, wherein the organic functional layer stack 303 has at least one organic light detecting layer. In the exemplary embodiment shown, the at least one organic light detecting layer is embodied as a pn junction for generating charge carriers.

In particular, the organic light detecting element 300 in the exemplary embodiment shown, with regard to the organic functional layer stack 303, for example, can have the same construction as the organic optoelectronic element 100 with regard to the organic functional layer stack 103. As a result, the manufacture of the mirror device shown can cause no or only low additional costs in comparison with a mirror device comprising only an organic optoelectronic element as shown in FIG. 1. As an alternative thereto, the organic light detecting element 300, in comparison with the organic light emitting element 100, can comprise different materials and/or have different layer constructions with regard to the organic functional layer stack 303.

Furthermore, electrode connection pieces 305 are present, which serve for electrically contacting the electrodes 302, 304 and which can be embodied like the electrode connection pieces 105 of the organic optoelectronic element 100. The electrode connection pieces 105, 305 extend from the elements 100, 300 out of the encapsulation 107, such that the elements 100, 300 can be contacted externally. The electrodes 302, 304 are electrically insulated from one another by insulator layers 306.

In contrast to the organic optoelectronic element 100, in the case of the organic light detecting element 300, the bottom electrode 302, that is to say the electrode arranged on the substrate, is embodied as non-transparent and reflective, for example, as is indicated by the hatching, while the top electrode 304 arranged on the opposite side relative to the substrate is embodied as transparent or light-transmissive at least in partial regions. The top electrode 304 can comprise, for example, a transparent material such as a TCO, for instance. Alternatively or additionally, it may also be possible for the top electrode 304 to be embodied as a ring contact and to have, for example, as viewed from the substrate, an opening above the organic functional layer stack 303 of the organic light detecting element 300, as is indicated by the dashed lines. Such an opening can be completely enclosed by the electrode material in a lateral direction, such that the electrode 304 can be embodied as a complete ring. Furthermore, it is also possible for an electrode 304 embodied as a ring contact to enclose the opening only in a partial region in a lateral direction and thus to be embodied in a U-shaped fashion, for example. Furthermore, the electrode 304 can alternatively or additionally comprise some other transparent electrode material mentioned above.

By virtue of the transparent top electrode 304 and the non-transparent bottom electrode 302, the organic light detecting element 300 in this exemplary embodiment is designed to detect ambient light 4 which is radiated onto the organic optoelectronic component from the opposite side relative to the substrate, while the organic optoelectronic element 100 detects ambient light 3 from the substrate side. The organic light detecting element 300 can thus form a reference sensor that measures the general brightness. Depending on this measurement, particularly in the case of a low ambient brightness ascertained, such as at night, for example, the organic optoelectronic element 100 can be operated in the first operating state. Independently of the measurement of the organic light detecting element 300, the organic optoelectronic element 100 can be operated as a light source in the second operating state in the case of a mirror device for a motor vehicle, for example, in the stationary vehicle.

As an alternative to the exemplary embodiment shown, the organic light detecting element 300 can also be designed to detect ambient light through the substrate or on both sides.

Figure 5:
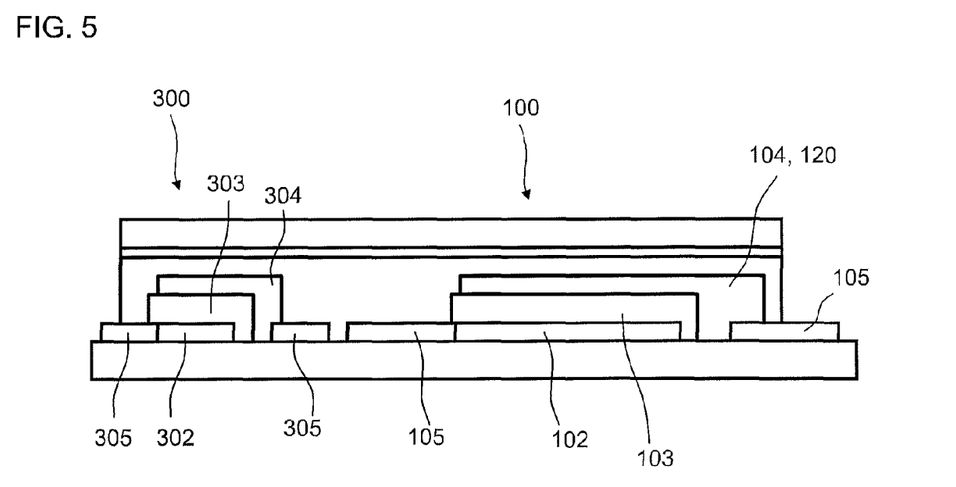

FIG. 5 shows a further exemplary embodiment of a mirror device, wherein, in comparison with the exemplary embodiments shown above, no insulator layers 106, 306, 112 are present. The electrodes 102, 104 and 302, 304 shown in the exemplary embodiment shown are formed, for example, by means of suitable mask processes during production in such a way that no short circuits arise even without insulator layers 106, 306 and the thus partially open organic layers. A corresponding construction is also possible in the case of an organic light emitting element 200 alongside the organic optoelectronic element 100.

As is shown in the following figures, it is also possible for a plurality of organic optoelectronic, light detecting and/or light emitting elements to be combined with one another.

FIGS. 6A to 6M show, in plan views of the viewing side, that is to say the substrate side, of the mirror device, variation possibilities for the arrangement, the number and the position of organic optoelectronic elements 100, organic light emitting elements 200 and organic light detecting elements 300 in accordance with a plurality of exemplary embodiments, wherein, for the sake of clarity, only the positions of the elements are indicated, without exact illustration of the luminous area and the contact feeds. The organic light detecting elements 300 are provided purely by way of example for detecting ambient light on the side of the mirror device facing away from the substrate, while the organic optoelectronic elements 100 are provided purely by way of example for detecting ambient light through the substrate in a first operating state and for emitting light through the substrate in a second operating state.

Figure 6A:
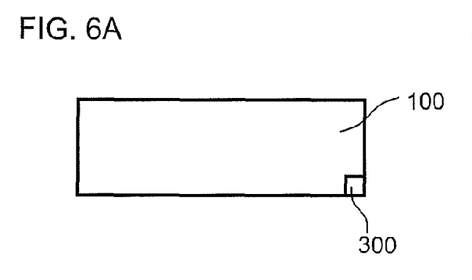
FIGS. 6A to 6M show schematic illustrations of dimmable mirror devices in accordance with further exemplary embodiments.
Figure 6B:
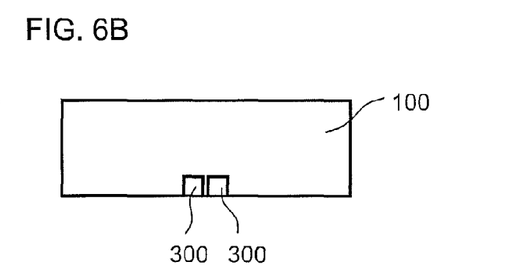

As is shown in FIGS. 6A and 6B, by way of example, an organic optoelectronic element 100 can be provided in large-area fashion and in particular also provide the reflective layer of the mirror device, while one or a plurality of organic light detecting elements 300 are provided in edge or corner regions.

Figure 6C:
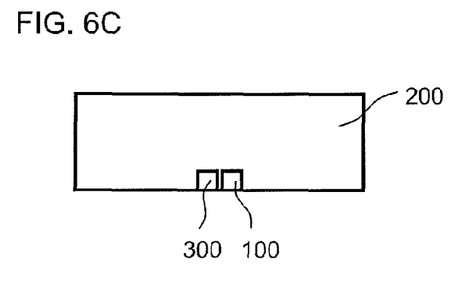
Figure 6D:
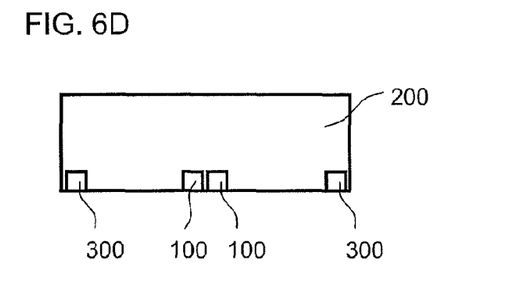

As an alternative thereto, by way of example, instead of the large-area organic optoelectronic element 100, a large-area organic light emitting element 200 can be provided, which comprises a reflective electrode forming at least one part of the reflective layer of the mirror device, while one or a plurality of organic optoelectronic elements 100 and furthermore also one or a plurality of organic light detecting elements 300 can be provided, as is shown in FIGS. 6C and 6D.

Figure 6E:
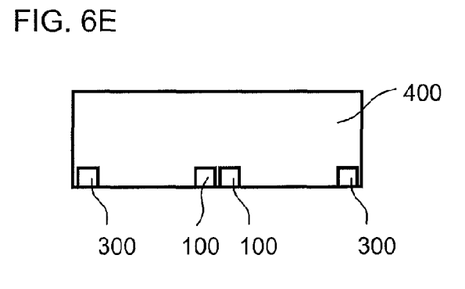
Figure 6F:
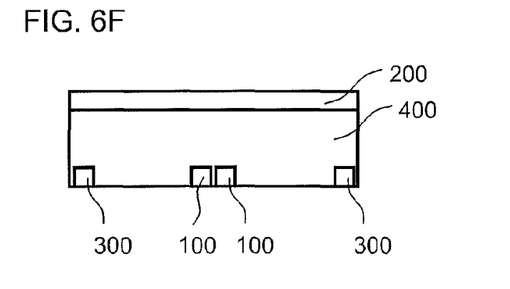
Figure 6G:
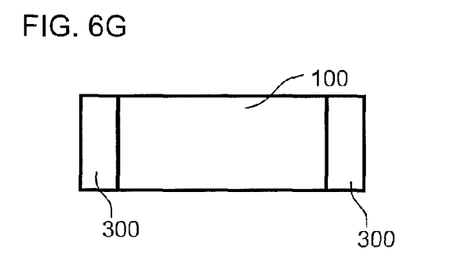
Figure 6H:
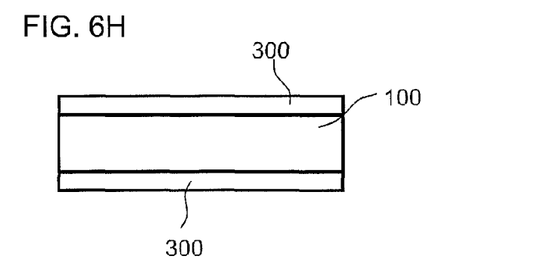
Figure 6I:
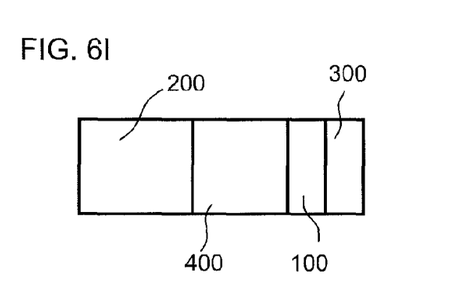
Figure 6J:
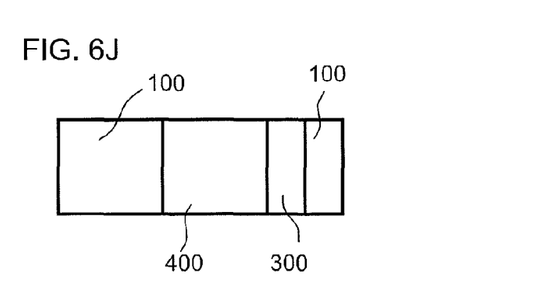
Figure 6K:
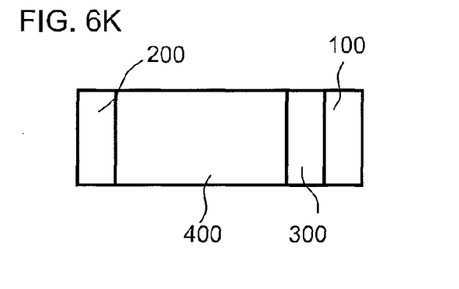
Figure 6L:
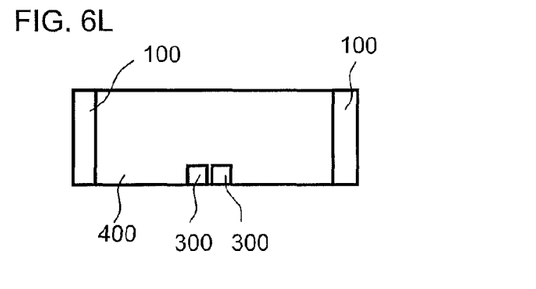
Figure 6M:
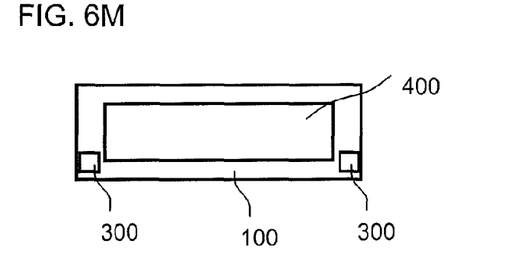

A mirror surface 400 can be provided at least in partial regions of the mirror device, which mirror surface can be arranged, for example, laterally alongside the elements 100, 200, 300 on the substrate, as is shown in FIGS. 6E and 6F.

FIGS. 6G to 6M show further possibilities for the arrangement of the elements 100, 200, 300 and of the mirror surface 400, wherein these can, for example, also be embodied in a strip- or frame-shaped fashion.

In addition to the exemplary embodiments shown, combinations and variations of the shown arrangements of the shown elements 100, 200, 300 and of the mirror surface 400 are possible. In particular, arbitrary combinations of the mirror surface 400, of the luminous areas of organic optoelectronic and/or light emitting elements 100, 200 and the detection of ambient light on the substrate side and the opposite side are possible. The organic light emitting elements 200 shown in the exemplary embodiments shown can also be embodied as an organic optoelectronic elements and/or as an organic light detecting elements.

Figure 7:
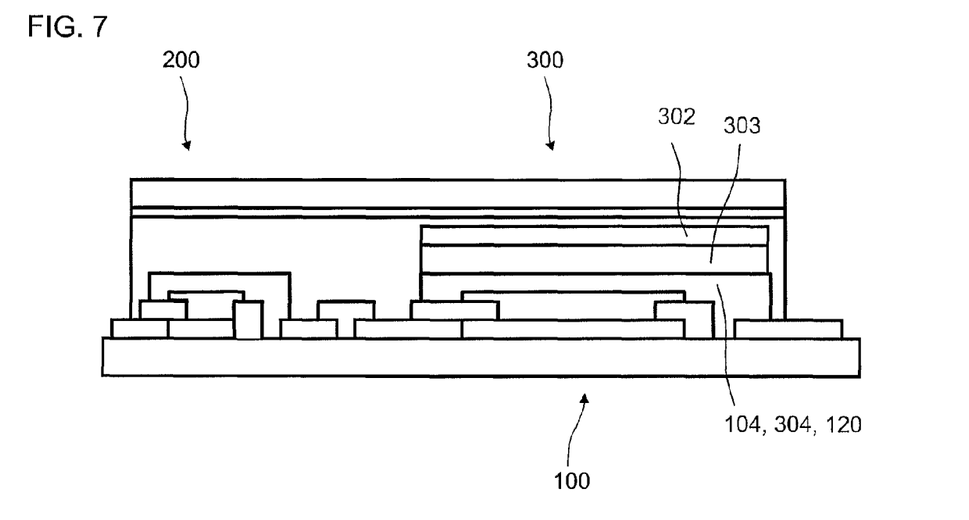
Figure 8A:
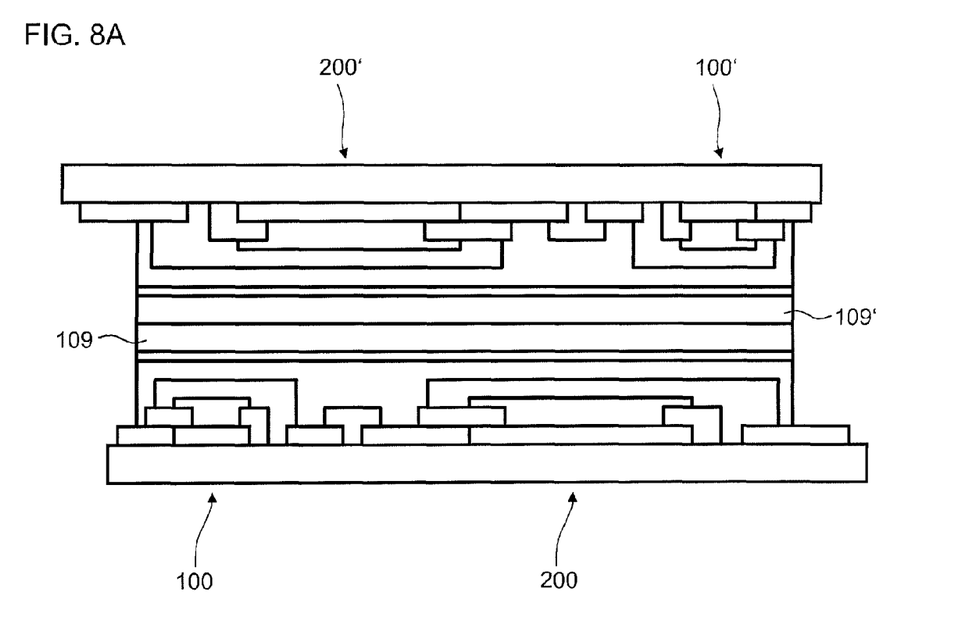
Figure 8B:
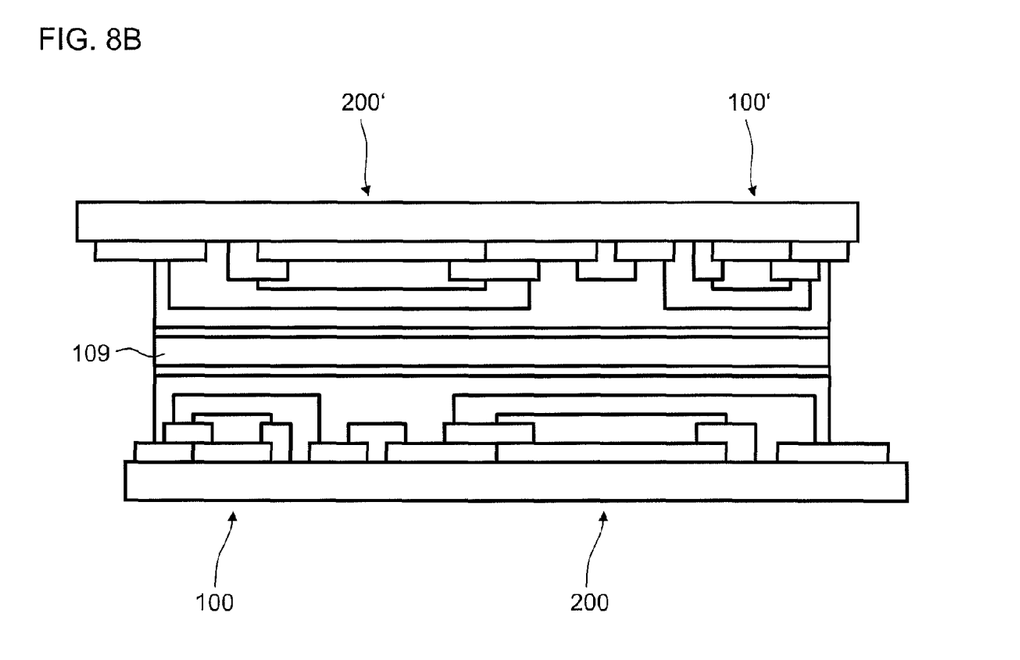

Furthermore, a double-sided layer construction is also possible, as is shown in the exemplary embodiments in FIGS. 7 to 8B.

FIG. 7 shows a mirror device comprising, in comparison with the exemplary embodiment in FIGS. 2A and 2B, as viewed from the substrate, on the organic optoelectronic element 100, an organic light detecting element 300 for detecting ambient light which is radiated onto the mirror device from the opposite side relative to the substrate.

As described in connection with the previous exemplary embodiments, the organic light detecting element 300 comprises between two electrodes 302, 304 an organic functional layer stack 303 having at least one organic light detecting layer, wherein one of the electrodes 304, which simultaneously also forms the reflective layer 120 of the mirror device in the exemplary embodiment shown, is formed by the electrode 104 of the organic optoelectronic element 100. In other words, the organic optoelectronic element 100 and the organic light detecting element arranged thereabove comprise a common electrode 104, 304. The top electrode 302 is embodied as transparent or at least semitransparent. The electrode connection pieces for the electrode 302 project out of the plane of the drawing and are therefore not shown.

FIGS. 8A and 8B show mirror devices which are formed purely by way of example by a doubling of the elements in accordance with the exemplary embodiment in FIG. 3, which are applied to one another in a manner facing away from one another, such that a dimmable double mirror arises, that is to say a mirror device that is specularly reflective on both sides, wherein both sides are dimmable by means of a respective substrate comprising electrochromic material. In particular, the mirror devices of the exemplary embodiments in FIGS. 8A and 8B comprise on each side, purely by way of example, an organic optoelectronic element 100, 100' and a large-area organic light emitting element 200, 200'. In contrast to the exemplary embodiment in FIG. 8A, wherein the elements applied to one another are arranged with the respective covers 109, 109' one on top of the other, the exemplary embodiment in FIG. 8B has only one cover 109 as connecting element.

Figure 9:
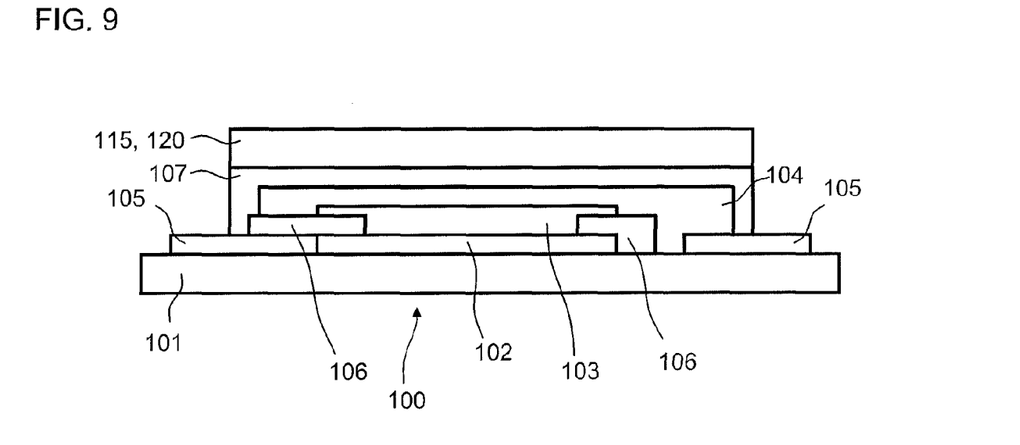

FIG. 9 shows a further exemplary embodiment of a mirror device comprising, in comparison with the previous exemplary embodiments, an organic optoelectronic element 100 having a transparent or regionally light-transmissive electrode 104 facing away from the substrate. Furthermore, the mirror device comprises a mirror layer 115 having a regulatable reflectivity on an opposite side of the organic optoelectronic element relative to the substrate. The reflective layer 120 of the mirror device is at least partly formed by the mirror layer 115 having the regulatable reflectivity.

In particular, the mirror layer 115 having the regulatable reflectivity also has a regulatable transparency, such that the mirror layer 115 can optionally be switched to be reflective or transparent. By way of example, the mirror layer 115 can comprise an electrochromic material and/or a liquid crystal material whose reflectivity and/or transmissivity can be dependent on an applied voltage, for example. As an alternative to a continuous layer, the mirror layer 115 can also be present only partially or be switchable only partially with regard to its reflectivity and transmissivity.

The mirror layer 115 having the regulatable reflectivity and the regulatable transparency is provided and designed, in particular, for switching the opposite side of the mirror device relative to the substrate to be at least partly transparent in desired measurement intervals, during which the organic optoelectronic element 100 can also detect ambient light on that side of the mirror device which faces away from the substrate. As described above, such a measurement can be suitable as a reference measurement, for example, by means of which the general brightness, that is to say, for example, the daylight, can be ascertained, such that the mirror device is operated, for example, only if the general brightness falls below a certain value, that is to say, for example, during the night or in dark surroundings.

By means of fast switching, that is to say in particular faster than the perception of the human eye, for example, with a switching time of less than 3 ms, it is possible to achieve asynchronous detection of ambient light on the two sides with momentary detection of the ambient light on that side of the mirror device which faces away from the substrate. The ambient light incident on the opposite side relative to the substrate is switched in here only momentarily in accordance with the desired measurement duration and the desired measurement interval.

The mirror device shown, with only one organic optoelectronic element 100, can optionally be operated as a dimmable mirror with ambient light detection on both sides and also, as described, for example, in association with FIG. 1, as a light source.

The features and exemplary embodiments described in association with the figures can be combined with one another in accordance with further exemplary embodiments, even if such combinations are not explicitly described with the individual figures. Furthermore, the exemplary embodiments shown in the figures can have further or alternative features in accordance with the general description.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A dimmable mirror device, comprising:
a substrate comprising an electrochromic material that has a controllable transparency;
an organic optoelectronic element disposed on the substrate, the optoelectronic element comprising an organic functional layer stack having an organic optoelectronic layer between two electrodes, the layer being embodied as an organic light detecting layer that detects ambient light through the substrate in a first operating state of the mirror device, such that the organic optoelectronic element acts as an organic light detecting element in the first operating state, wherein the transparency of the substrate can be regulated depending on a measurement signal of the organic optoelectronic element in the first operating state; and
a reflective layer on a side of the organic functional layer stack facing away from the substrate.

2. The mirror device according to claim 1, wherein an electrode of the organic optoelectronic element is in direct contact with the substrate, and wherein a base surface of the substrate facing away from the organic optoelectronic element forms an outer surface of the mirror device.

3. The mirror device according to claim 1, further comprising contact elements for electrically driving the electrochromic, the contact elements being arranged on the substrate and being spaced apart laterally with respect to the organic optoelectronic element.

4. The mirror device according to claim 3, wherein the contact elements are in direct contact with the substrate.

5. The mirror device according to claim 1, wherein the reflective layer comprises an electrode of the organic optoelectronic element facing away from the substrate.

6. The mirror device according to claim 1, wherein the reflective layer comprises a mirror layer having a regulatable reflectivity on an opposite side of the organic optoelectronic element relative to the substrate, and wherein the electrode of the organic optoelectronic element facing away from the substrate is transparent.

7. The mirror device according to claim 1, wherein the organic optoelectronic element comprises an organic photodiode, an organic photoconductor and/or an organic photoresistor.

8. The mirror device according to claim 1, wherein the organic optoelectronic layer of the organic optoelectronic element is further embodied as an organic light emitting layer that emits light in a second operating state of the mirror device.

9. The mirror device according to claim 8, wherein the organic optoelectronic element acts as an organic light emitting diode in the second operating state.

10. The mirror device according to claim 1, further comprising an organic light emitting element having an organic functional layer stack having at least one organic light emitting layer between two electrodes arranged on the substrate laterally adjacently to the organic optoelectronic element.

11. The mirror device according to claim 10, wherein the reflective layer comprises an electrode of the organic light emitting element facing away from the substrate.

12. The mirror device according to claim 1, further comprising an organic light detecting element is arranged on the substrate laterally adjacently to the organic optoelectronic element, the organic light detecting element being configured to detect ambient light radiated onto the mirror device from an opposite side of the mirror device relative to the substrate.

13. The mirror device according to claim 1, further comprising an organic light detecting element arranged on the organic optoelectronic element, as viewed from the substrate, the organic light detecting element being configured to detect ambient light which is radiated onto the mirror device from an opposite side of the mirror device relative to the substrate.

14. The mirror device according to claim 13, wherein the organic light detecting element comprises an organic functional layer stack between two electrodes, the organic functional layer having an organic light detecting layer, wherein one of the electrodes is formed by one of the electrodes of the organic optoelectronic element.

15. The mirror device according to claim 1, wherein the substrate comprises an electrochromic glass and/or an electrochromic foil.

16. The mirror device according to claim 1, wherein the mirror device is embodied as a rear-view mirror of a motor vehicle.

17. The mirror device according to claim 1, wherein the reflective layer is formed by an electrode of the optoelectronic element.

18. A dimmable mirror device, comprising:
a substrate comprising an electrochromic material which has a controllable transparency;
an organic optoelectronic element, disposed on the substrate, the optoelectronic element comprising an organic functional layer stack having an organic optoelectronic layer between two electrodes, the layer being embodied as an organic light detecting layer that detects ambient light through the substrate in a first operating state of the mirror device, such that the organic optoelectronic element acts as an organic light detecting element in the first operating state; and a reflective layer on a side of the organic functional layer stack facing away from the substrate;

wherein the transparency of the substrate can be regulated depending on a measurement signal of the organic optoelectronic element in the first operating state;

wherein at least one electrode of the organic optoelectronic element is in direct contact with the substrate;

wherein a base surface of the substrate facing away from the organic optoelectronic element forms an outer surface of the mirror device; and wherein the reflective layer comprises the electrode of the organic optoelectronic element facing away from the substrate.

19. A method of operating a dimmable mirror that comprises a substrate, an organic light detecting layer and a reflective layer on a side of the organic light detecting layer facing away from the substrate, the substrate comprising an electrochromic material with a controllable transparency and the organic light detecting layer comprising an organic functional layer structure having an organic optoelectronic layer between two electrodes, wherein the method comprises:

detecting ambient light through the substrate by the organic light detecting layer; and controlling the transparency of the substrate based on a measurement signal derived from the detecting by the organic light detecting layer.

* * * * *